METHOD AND APPARATUS FOR RAPID GOLD PLATING
INTEGRATED CIRCUIT SLICES
Filed July 5, 1968
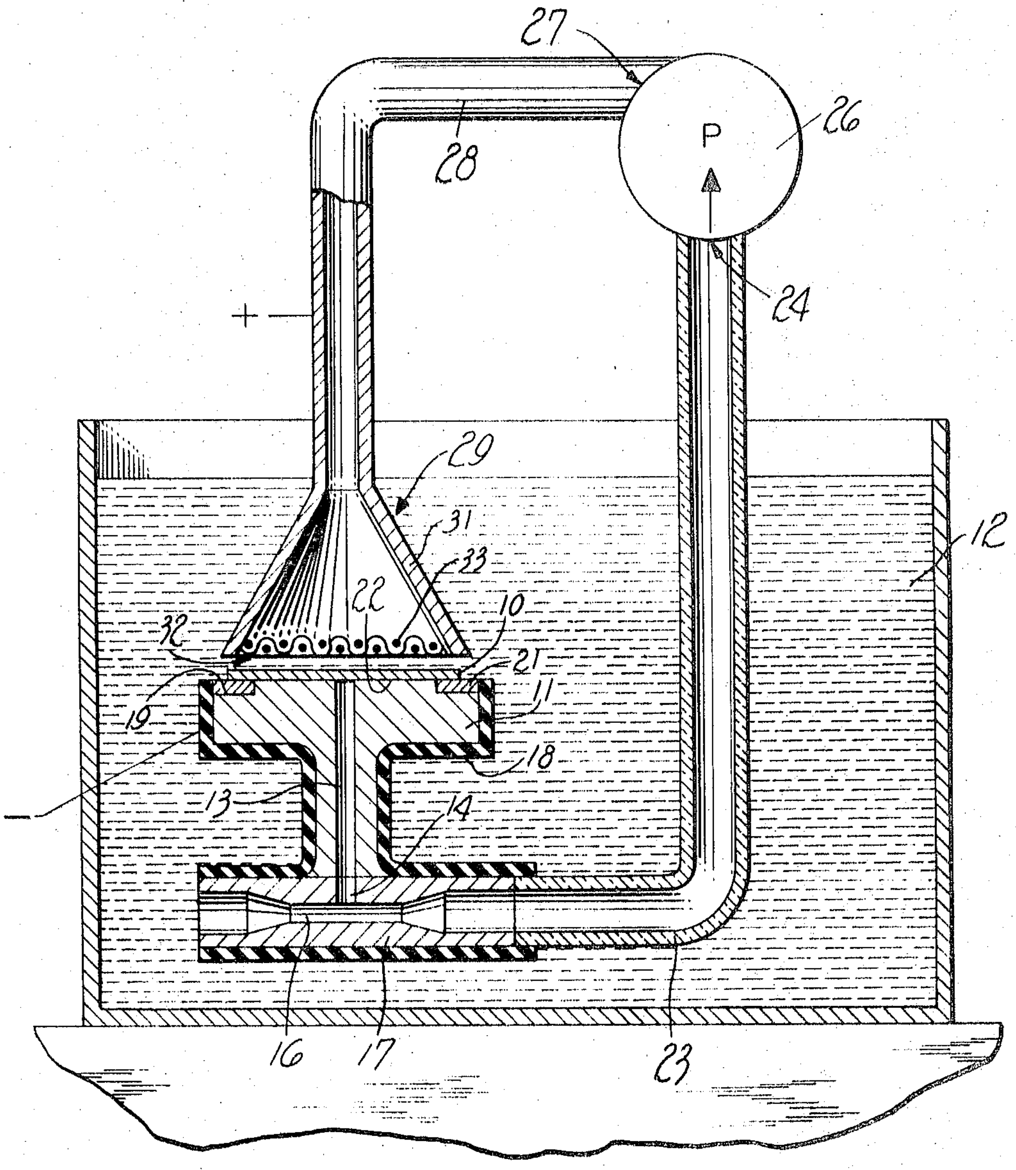
INVENTOR
E. J. PRITCHARD
By R. P. Miller
ATTORNEY United States Patent Office 3,536,594
Patented Oct. 27, 1970

3,536,594

METHOD AND APPARATUS FOR RAPID GOLD PLATING INTEGRATED CIRCUIT SLICES

Edwin J. Pritchard, Coopersburg, Pa., assignor to Western Electric Company, Incorporated, New York, N.Y., a corporation of New York Filed July 5, 1968, Ser. No. 742,633
Int. Cl. C23b *5/58, 5/70;* C23c *13/08*
U.S. Cl. 204—27 10 Claims

ABSTRACT OF THE DISCLOSURE

A silicon slice is plated by supporting the slice on a fixture which is submerged in a plating solution and which has a passageway therethrough terminating at one end at the slice supporting surface and communicating at the other end with a throat section of a venturi tube. Plating solution is drawn through the venturi and the resulting throat section pressure drop is impressed through the passageway to hold the slice against the fixture. The solution emanating from the venturi is forced through a discharge nozzle and is impinged on the slice. An electric field is then impressed across the fixture and discharge nozzle to effectuate the plating.

BACKGROUND OF THE INVENTION

This invention relates to a method of and apparatus for treating one side of a wafer-like article with a fluid and, more particularly, to a method of and an apparatus for simultaneously treating one side of an article with a fluid while utilizing a localized decrease in the pressure of the fluid to hold the article and to maintain the orientation thereof during the treating operation.

The invention, although not limited thereto, finds special utility in the manufacture of semiconductor devices of the beam lead type, wherein it is necessary to gold plate one side of a semiconductor substrate, such as a silicon slice, so as to provide electrical interconnections between the various elements of each device, and so as to provide the so-called beam leads necessary for mechanically connecting each device to a header or circuit pattern. Examples of such beam lead devices are disclosed in M. P. Lepsetter Pats. 3,287,612 and 3,335,338.

In the past, one side of a silicon or other semiconductive slice was gold plated by a process known as "meniscus plating." Generally speaking, this process comprised gripping the edges of a semiconductive slice in a spring-fingered fixture and supporting the slice just barely in contact with the meniscus of the surface of a slowly stirred gold plating bath. Although this method met with some success, it was inherently slow due, primarily, to the slow rate at which fresh plating solution came into contact with the semiconductor slice; and when employing a meniscus plating technique, plating rates were typically limited to approximately ten microns per hour. In addition, attempts to increase the plating rate by agitating the plating bath, and thereby increasing the rate at which fresh plating solution contacted the slice, often met with serious limitations, e.g., agitation often resulted in excessive turbulence and splashing at the bath surface and a consequent plating of gold on the underside of the semiconductor slice.

Several variations of the meniscus plating method, as well as several other methods of plating one side of a substrate, were attempted with the hope of greatly increasing the plating rate. These methods employed various means for holding the semiconductor slices, various means of agitating the plating bath, and often included various methods of and means for rotating the anode and/or the cathode employed in the process.

Although several of the attempted methods resulted in a plating rate of as much as five microns of gold per minute, they were often laden with problems. Some of the methods did not plate the gold with an even thickness over the entire surface of the semiconductor substrate, some were unpredictable as to the rate at which gold would be plated, and others caused excessive turbulence in the plating bath and a consequent loss of plating solution due to spillage.

Accordingly, it is desirable to plate one side of a substrate by a process which affords a rapid and consistently reproducible plating rate, which produces a uniform plating thickness over the entire surface being plated, and which avoids excessive spillage or waste of the plating solution being employed.

SUMMARY OF THE INVENTION

One solution to the problem is provided by the instant invention which, for the sake of brevity, is described herein only in connection with the rapid gold plating of one side of a semiconductor substrate.

In accordance with the present invention, a semiconductor substrate, such as a slice of silicon, is gold plated by placing the substrate on an electrically conductive supporting surface of a fixture having a passageway extending therethrough. The fixture passageway is designed so that it terminates at one end thereof in the slice supporting surface. The other end of the passageway is connected in fluid communication with a throat section of a submerged venturi tube. The fixture with the semiconductor slice supported thereon is then submerged in a suitable gold plating solution which is forced through the venturi tube. The increase in the velocity of the solution passing through the throat section of the venturi tube results in a pressure drop therein which is communicated through the passageway in the fixture and impressed on the semiconductor slice to hold the slice on the supporting surface. The gold plating solution emanating from the venturi tube is continuously forced through a filtered, electrically conductive discharge member, and projected onto the surface of the semiconductor substrate so as to maintain a fresh supply of solution at the plating site. While the plating solution is continuously being forced through the venturi tube and continuously being impinged on the slice, the electrically conductive fixture and discharge member are maintained at a prescribed potential difference such that the fixture and the semiconductor slice held thereto act as the plating cathode, while the distributing member acts as the plating anode.

BRIEF DESCRIPTION OF THE DRAWING

The figure is a sectional view illustrating the manner in which a silicon slice is held against an electrically conductive surface of a fixture, and beneath an electrically conductive solution discharge member to facilitate gold plating in accordance with the present invention.

DETAILED DESCRIPTION

Although the present invention may be used in the treating of various different articles with a variety of solutions, it has particular utility in the plating of one side of a wafer-like substrate and, accordingly, will be described herein only in connection with such plating.

Referring now to the drawing, there is shown a plating system, embodying certain principles of the present invention, for gold plating one side of a semi-conductive substrate, such as a silicon slice 10. The slice 10 is held in surface contact with a fixture 11 which is submerged in a suitable gold plating solution 12. The fixture 11 may be constructed of any suitable electrically conductive material which will not dissolve in the plating solution 12 and which may be maintained at a predetermined polarity so as to act as a plating cathode. For example, the fixture materials may include various metals plated with platinum or gold. In addition, the fixture 11 may be formed in essentially any configuration which can accommodate the slice 10 to be plated, and which has extending therethrough a passageway 13 that terminates at one end thereof in the surface of the fixture which contacts and supports the slice. As shown in the figure, the other end of the passageway 13 communicates with a bore 14 formed in a throat section 16 of the venturi tube 17 which cooperates with the passageway 13 in the fixture 11 to hold the slice 10 against the fixture during the plating process.

In the illustrated embodiment, the venturi tube 17 and fixture 11 (other than that portion in electrical contact with the slice 10) are coated with an insulating material 18, such as silicone rubber or polytetrafluoroethylene. This expedient will preclude any gold from plating on the venturi tube 17 or the fixture 11, and will result in a more economical process. Additionally, to prevent any undesirable gold plating on the side of the slice 10 in contact with the fixture 11, it is preferred that the peripheral portions of the slice overlie and contact an insulating material. As shown in the figure, this may be accomplished by providing the fixture 11 with an annular recess 19 on which is fitted an annular ring or seal 21 constructed of an insulating material, such as silicone rubber or polytetrafluoroethylene. The seal 21 prevents the plating solution 12 from contacting the underside 22 of the slice 10, and thereby precludes any undesirable plating thereof.

As illustrated in the figure, one end of the venturi tube 17 is connected by a suitable conduit 23 to the inlet end 24 of a pumping means 26, while the other end of the venturi tube is in fluid communication with the gold plating solution 12. The outlet end 27 of the pumping means 26 is connected by a suitable conduit 28 to a hollow, electrically conductive discharge member 29, the flared mouth of which is positioned a predetermined distance above the slice 10 to overlie and discharge the plating solution thereon. The configuration of member 29, as illustrated, includes a frusto-conically shaped discharging head 31 having a flared mouth 32 which is substantially equal in size and cross section to the exposed surface of the slice 10 to ensure a substantially uniform distribution of fresh solution over the entire surface thereof. It is also preferred that a permeable member, such as a metal screen 33 be fitted across the mouth 32 to evenly distribute both the plating solution 12 and the electric field (potential difference) across the surface of the slice 10. The member 29 may be constructed of various electrically conductive materals, but it is preferably constructed of a material, such as titanium coated with platinum, which is inert to the deposition of gold. The conduits 23, 28 should also be constructed of a material which is inert to the gold plating solution 12 and which is nonconductive, such as polyvinyl chloride, polytetrafluoroethylene, and the like.

OPERATION

In accordance with the illustrated embodiment of the present invention, a silicon slice 10 is gold plated on one side only by supporting the slice on the electrically conductive surface of the fixture 11 of the plating assemblage shown in the figure. Then, the assemblage, excluding the pumping means 26 and a portion of conduits 23 and 28, is submerged in the gold plating solution 12, whereupon the pumping means 26 is actuated to continuously draw the plating solution 12 through the venturi tube 17 and to continuously discharge the solution through the screen 33, fitted across the flared mouth 32 of member 29, and onto the slice 10.

As the solution 12 passes through the throat section 16 of the venturi tube 17, a reduced pressure head results therein. The pressure drop in the throat section 16 is communicated through the bore 14 and the passageway 13, and acts to hold the slice 10 against the fixture 11 and against the annular seal 21, thus precluding the plating solution from contacting the side of the slice engaging the fixture 11. While the pumping means 26 is operating in cooperation with the venturi tube 17, passageway 13 and bore 14 to hold the slice 10 against the fixture 11 and the seal 21, it is also cooperating with the discharge member 29 to continuously impinge fresh plating solution 12 onto the surface of the slice 10. Finally, while the slice is held in position, and while fresh plating solution is being uniformly distributed and impinged thereon, a predetermined plating energy is applied across member 29 and fixture 11 to gold plate one side of the slice 10.

It is to be understood that the above-described embodiment is simply illustrative of the principles of the invention. Thus, although the invention has been described in connection with a particular sequence of steps for assembling and using a gold plating apparatus, it is to be understood that its use is not so limited, and that it may be employed in carrying out other plating processes, as well as treating processes other than plating, such as cleaning, etching, leaching, polishing, etc. Various other modifications and changes may be devised by those skilled in the art which will embody the principles of the invention and fall within the spirit and scope thereof.

What is claimed is:

1. An apparatus for holding an article and for projecting a stream of fluid thereon, which comprises:
   - a holder having a surface for supporting an article, said holder having a passageway therethrough terminating at a first end thereof in said surface;
   - a venturi tube having a throat section and a bore extending therefrom;
   - means for communicating said bore with the second end of said holder passageway;
   - means for forcing fluid through said venturi tube to impress a reduced pressure through said communicating means to hold said article against said surface; and
   - means for projecting the fluid emanating from said venturi tube onto said article.

2. An apparatus for treating an article with a fluid which comprises:
   - a support for the article defining a fluid passage closeable at one end thereof by the article resting on said support;
   - a venturi tube having a throat section in fluid communication with another end of said fluid passage;
   - means for forcing an article treating fluid through said venturi tube to impress a reduced pressure through said throat section and through said fluid passageway to hold said article against said support; and
   - means in communication with said venturi tube to project said treating fluid emanating from said venturi tube onto said article.

3. An apparatus as set forth in claim 2, wherein said fluid projecting means comprises:
   - a conduit having a flared mouth, an opening of which overlies the article; and
   - a permeable member connected across said flared mouth for uniformly distributing said emanating fluid against said article.

4. In an apparatus for electroplating a slice of semiconductive material;
   - a fixture having an electrically conductive surface for supporting a semiconductor slice and having a passageway therethrough, said passageway terminating at a first end thereof in said support surface;
   - a venturi tube having a throat section and a bore extending therefrom into said passageway;
   - an electrically conductive conduit having a flared mouth and an opening which overlies said slice;
   - a permeable, electrically conductive member connected across said mouth for uniformly distributing a fluid emanating therefrom, said member characterized by an ability to uniformly distribute an electric field over the surface of said slice;

means interposed between said venturi tube and said conduit and communicating therewith for drawing a plating solution through said venturi tube and for forcing said solution through said conduit and onto said slice, whereupon a reduced pressure in said throat is impressed through said fixture passageway to hold said slice against said fixture; and means for impressing an electric field across said conduit and said conductive surface of said fixture to apply electroplating energy through said solution to electroplate said slice.

5. In an apparatus as set forth in claim 4, which further includes:

means for electrically insulating said venturi tube, said throat-fixture passageway communicating means and the exposed portions of said fixture other than said support surface.

6. In an apparatus for plating one surface of an article;

a support having a surface conforming to the configuration of the surface of the article that is not to be plated, said support having a recess about the periphery thereof conforming in shape to the periphery of the article, said support having a passageway therethrough terminating at a first end in said support surface;

a seal mounted in said recess to seal the surface that is not being plated;

means for circulating plating solution past the second end of said passageway and onto the exposed surface of said article; and means responsive to the fluid passing said second end of said passageway for applying a reduced pressure through said passageway to hold said article against said seal.

7. An apparatus as defined in claim 6, which includes:

a tank filled with a plating solution for receiving said support.

8. A method of applying fluid to an article supported on a surface having a passageway exiting at one end therein, comprising the steps of:

placing the article and the supporting surface in a fluid;

recirculating said fluid past the other end of the passageway and impinging said fluid on said article; and reducing the pressure head of said circulating fluid passing said other end of said passageway to impress a holding force through said passageway to said article.

9. A method as defined in claim 8, wherein said fluid is an electroplating solution, and wherein an additional step comprises:

applying electroplating energy through the solution to electroplate said article.

10. A method of electroplating one side of a slice of semiconductive material which includes the steps of:

placing the slice on an electrically conductive surface of a support fixture having a passageway therethrough, said passageway terminating at one end in said surface;

communicating a throat section of a venturi tube to the other end of said passageway;

immersing said slice, support fixture and venturi tube in an electroplating solution;

drawing said solution through said venturi tube to impress a reduced pressure through said passageway to hold said slice against said surface;

projecting the solution emanating from said venturi tube onto said slice; and applying electroplating energy through said solution to electroplate said slice.

References Cited

UNITED STATES PATENTS

| | | | |
|---|---|---|---|
| 2,366,935 | 1/1945 | Schmid | 269—21 |
| 2,987,460 | 6/1961 | Mizia | 204—297 |
| 3,317,410 | 5/1967 | Croll et al. | 204—23 |
| 3,461,838 | 8/1969 | Nelson et al. | 118—50 |
| 3,481,858 | 12/1969 | Fromson | 204—297 |

JOHN H. MACK, Primary Examiner

T. TUFARIELLO, Assistant Examiner

U.S. Cl. X.R.

118—50; 204—273, 275, 297; 269—21